(12) United States Patent
Lui et al.

(10) Patent No.: US 6,476,739 B1
(45) Date of Patent: Nov. 5, 2002

(54) METHOD AND PROCESSING SYSTEM FOR ESTIMATING LIKELIHOOD RATIOS FOR INPUT SYMBOL VALUES

(75) Inventors: Gee L. Lui, Westminster, CA (US); Kuang Tsai, Santa Ana, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 09/956,392

(22) Filed: Sep. 18, 2001

(51) Int. Cl.[7] .............................................. H03M 13/12
(52) U.S. Cl. ...................................................... 341/107
(58) Field of Search ................................. 341/107, 106, 341/79, 75, 94; 375/262, 795, 796

(56) References Cited

U.S. PATENT DOCUMENTS

| | | | | |
|---|---|---|---|---|
| 5,162,797 A | * | 11/1992 | Murata | 341/107 |
| 5,181,209 A | | 1/1993 | Hagenauer et al. | 371/43 |
| 5,881,106 A | * | 3/1999 | Cartier | 341/107 |

OTHER PUBLICATIONS

J. Hagenauer and P. Hoeher, "A Viterbi Algorithm with Soft–Decision Outputs and its Applications," *Proc. of Globecom '89*, Dallas, TX, USA, Nov. 1989, pp. 47.1.1–47.1.7.

C. Berrou, P. Adde, E. Angui, and S. Faudeil, "A low complexity soft–output Viterbi decoder architecture," *Proc. IEEE ICC '93*, Geneva, Switzerland, pp. 737–740, May 1993.

H. Zheng, "Turbo Codes—Soft Output Viterbi Algorithm Realization and Phase Synchronization in Low SNRS," Masters Thesis submitted to The University of Utah, Mar. 1998.

H. Mathis, "Differential Detection of GMSK Signals with Low BT Using the SOVA," *IEEE Transacations on Communications*, vol. 46, No. 4, pp. 428–430, Apr. 1998.

* cited by examiner

*Primary Examiner*—Brian Young
(74) *Attorney, Agent, or Firm*—Henricks, Slavin & Holmes LLP

(57) ABSTRACT

A method and processing system for determining a soft decision metric for each input symbol, including and/or performing the steps of: computing trellis branch metrics based on a received sample sequence; updating initial state metrics from time (n−1) with a Viterbi algorithm (VA); constraining M trellises differently at time n such that only state transitions caused by an input value associated with a particular trellis are allowed; executing the VA on the M constrained trellises for a finite number ($N_d$) steps; and computing likelihood ratios by taking a difference of a maximum state metric at time ($n+N_d$) for each trellis with a maximum state metric of a reference trellis.

16 Claims, 6 Drawing Sheets

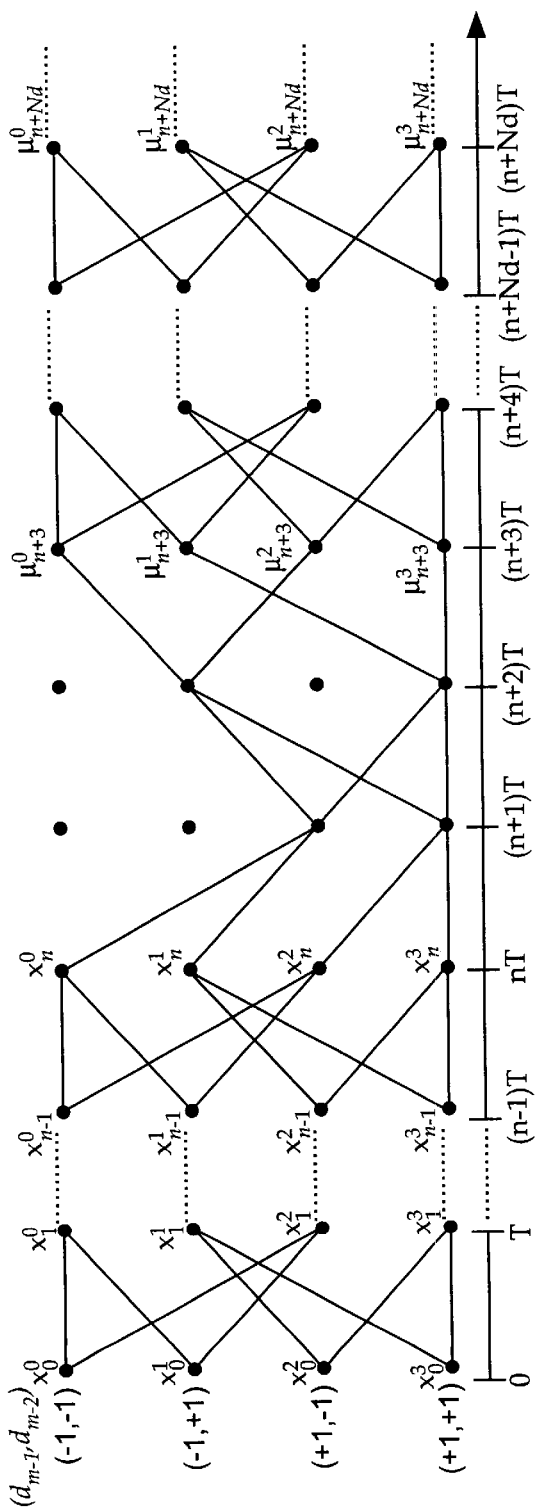
FIG. 2a  2-FILTER + 1 TRELLIS
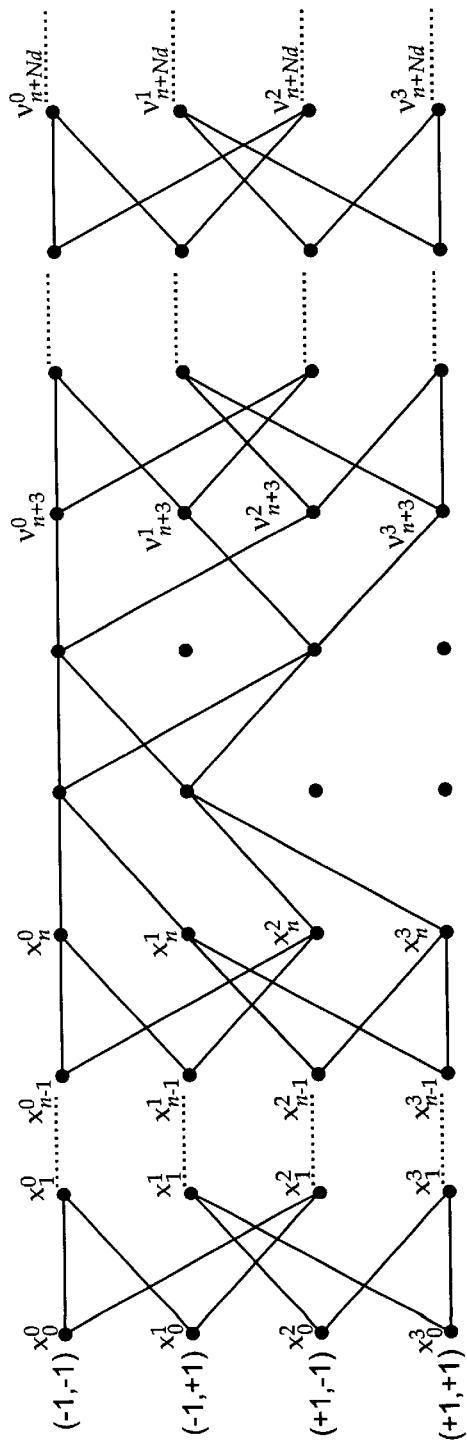
FIG. 2b  2-FILTER - 1 TRELLIS

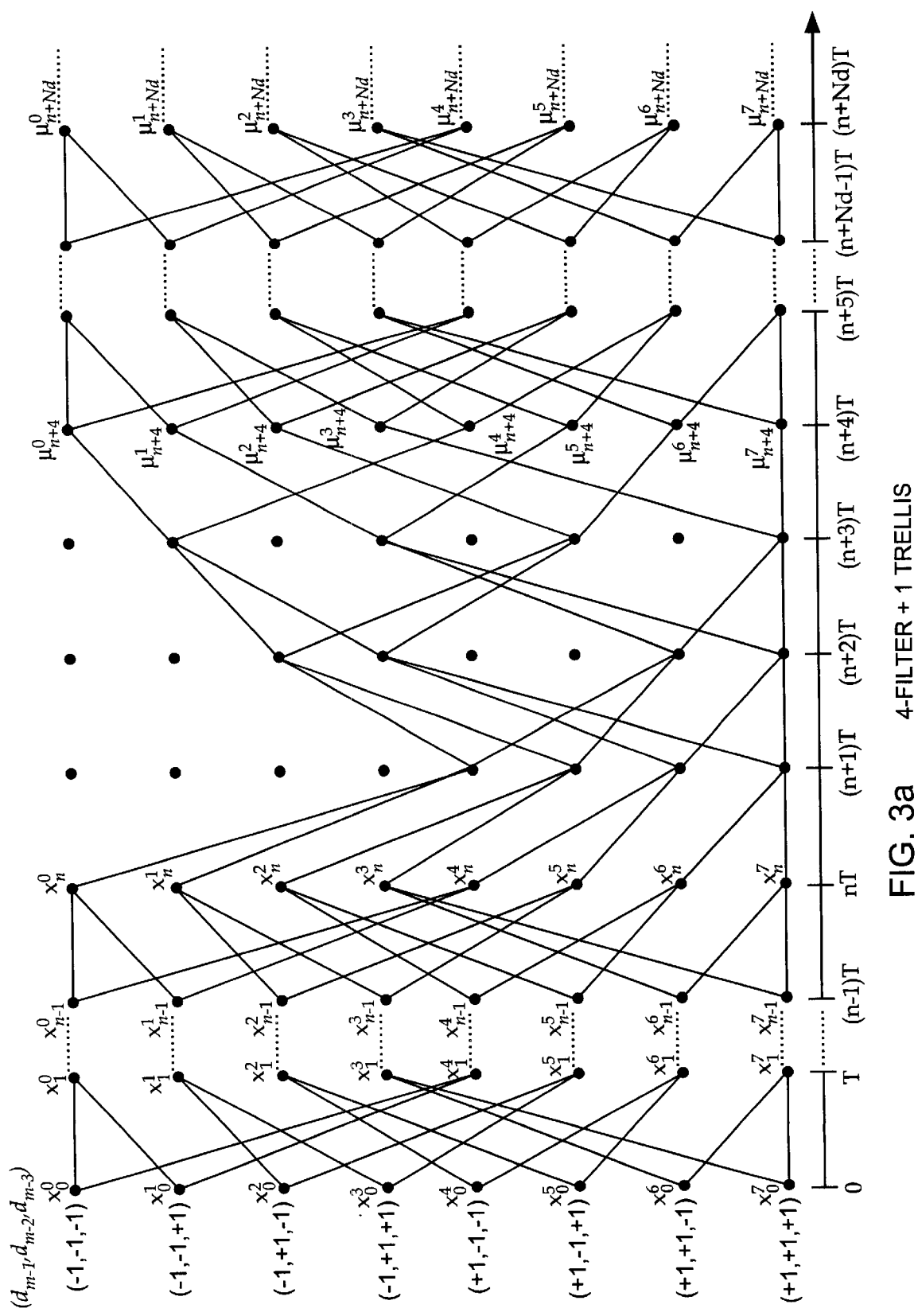
FIG. 3a   4-FILTER + 1 TRELLIS

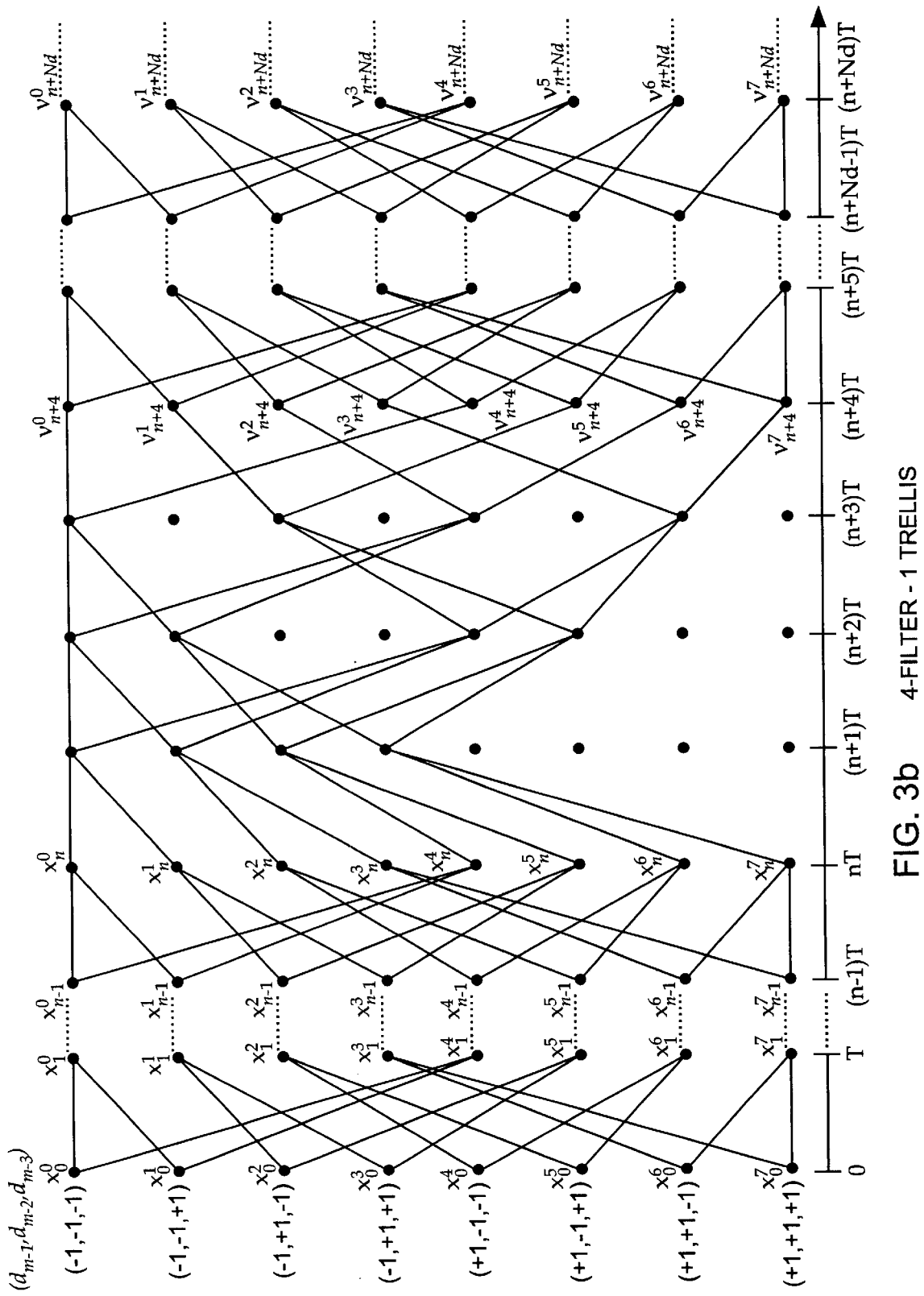
FIG. 3b  4-FILTER - 1 TRELLIS

METHOD AND PROCESSING SYSTEM FOR ESTIMATING LIKELIHOOD RATIOS FOR INPUT SYMBOL VALUES

BACKGROUND OF THE INVENTION

1. Field of Invention

The present invention relates to a method and processing system for estimating likelihood rations for input symbol values and, more particularly, a method and processing system for determining a soft decision metric for each input symbol.

2. Description of the Related Art

The Viterbi algorithm is a standard tool in communications receivers, which are used to perform various functions such as demodulation, decoding, equalization, etc. It is also known to employ two Viterbi algorithms in a concatenated fashion. For example, Trellis-Coded Modulation (TCM) and Continuous-Phase Modulation (CPM) communication systems both employ a Viterbi algorithm for data demodulation. By employing an additional outer convolutional code in such systems, another Viterbi algorithm must be used to perform the forward error correction (FEC) decoding operation after the Viterbi data demodulator. However, a problem with such an application is that since the inner Viterbi algorithm only generates hard (binary) decisions on code symbols, the outer Viterbi algorithm can only perform hard-decision decoding of the received data, resulting in sub-optimum decoding performance.

There are a variety of cases in which an outer receiver stage would perform better if soft decisions could be derived for each symbol at an inner receiver stage. For example, in order to optimize the decoding performance in a digital data transmission system employing FEC code, the data demodulator must supply soft data decisions to the FEC decoder. There is not, however, any direct way to extract soft decisions for each individual symbol in the conventional Viterbi algorithm.

SUMMARY OF THE INVENTION

In accordance with one embodiment of the present invention, a method for approximating a posteriori probabilities of input symbols to a finite state machine includes the steps of: exercising a Viterbi algorithm over M differently constrained trellises, one trellis for each of M possible input symbol values, and taking a difference of maximum state metrics of the differently constrained trellises to form likelihood ratios. A key aspect of the present invention is the design of the differently constrained trellises (e.g., +1 and −1 trellises) and the exploitation of the Viterbi algorithm to efficiently determine the bit likelihood ratios on a bit-to-bit basis.

In accordance with another embodiment of the present invention, a method for determining a soft decision metric for a $n^{th}$ input symbol includes the steps of: computing trellis branch metrics based on a received sample sequence; updating initial state metrics from time (n−1) with a Viterbi algorithm (VA); constraining M trellises differently at time n such that only state transitions caused by an input value associated with a particular trellis are allowed; executing the VA on each of the M constrained trellises for a finite number ($N_d$) steps; and computing likelihood ratios by taking a difference of a maximum state metric at time ($n+N_d$) for each trellis with a maximum state metric of a reference trellis.

In accordance with another embodiment of the present invention, a method for estimating likelihood ratios of the input symbol values of an encoded sequence includes the steps of: providing an optimal decision metric for symbol-by-symbol detection; making relaxations or simplifications to the optimal decision metric to provide an approximation to the optimal decision metric; and processing a sample sequence employing a Viterbi algorithm (VA) and differently constrained trellises to implement the approximation to the optimal decision metric. In a preferred method, the processing step includes the steps of: exercising the VA over the differently constrained trellises for samples of the sample sequence; and taking a difference of maximum state metrics of the differently constrained trellises.

In accordance with another embodiment of the present invention, a processing system for estimating likelihood ratios for input symbol values includes a processor configured to compute likelihood metrics on a symbol-by-symbol basis to determine an approximation to a maximum a posteriori estimate of a given symbol based on computing a maximum correlation of a received signal with all possible transmitted signals using a Viterbi algorithm over differently constrained trellisses. In a preferred processing system, the differently constrained trellises are M differently constrained trellises, where M is a number of possible input values. In a preferred embodiment, the processor is configured to decode signals provided to the processor in accordance with a concatenated coding scheme. In a preferred embodiment, the processor is configured to implement hard or soft demodulation of continuous phase modulation (CPM) signals, e.g., uncoded CPM signals, coded CPM signals, binary CPM signals, 4-ary CPM signals, etc.

In accordance with another embodiment of the present invention, a processing system for estimating likelihood ratios for input symbol values includes a decoder configured to implement a Viterbi algorithm (VA) on M differently constrained trellises for M values that an input to the decoder can take on at any given instant. By way of example, for a binary input, the M differently constrained trellises comprise two trellises.

Thus, the method and processing system of the present invention are embodied in a soft output Viterbi algorithm (SOVA) that provides a high performance metric that can be applied to either hard or soft decoding of error corrected code and pre-coded CPM signals (e.g., with a modulation index of 0.5), resulting in simplification of instrumentation in terms of computational and storage requirements.

The above described and many other features and attendant advantages of the present invention will become apparent as the invention becomes better understood by reference to the following detailed description when considered in conjunction with the accompanying drawings.

BRIEF DESCRIPTION OF THE DRAWINGS

Detailed description of preferred embodiments of the invention will be made with reference to the accompanying drawings:

FIGS. 2A and 2B illustrate 2-filter+1 and 2-filter −1 trellises, respectively;

FIGS. 3A and 3B illustrate 4-filter+1 and 4-filter −1 trellises, respectively;

communication system with a soft output Viterbi algorithm (SOVA) demodulator and soft-decision Viterbi decoding according to an exemplary preferred embodiment of the present invention.

DETAILED DESCRIPTION OF THE PREFERRED EMBODIMENTS

Figure 1:
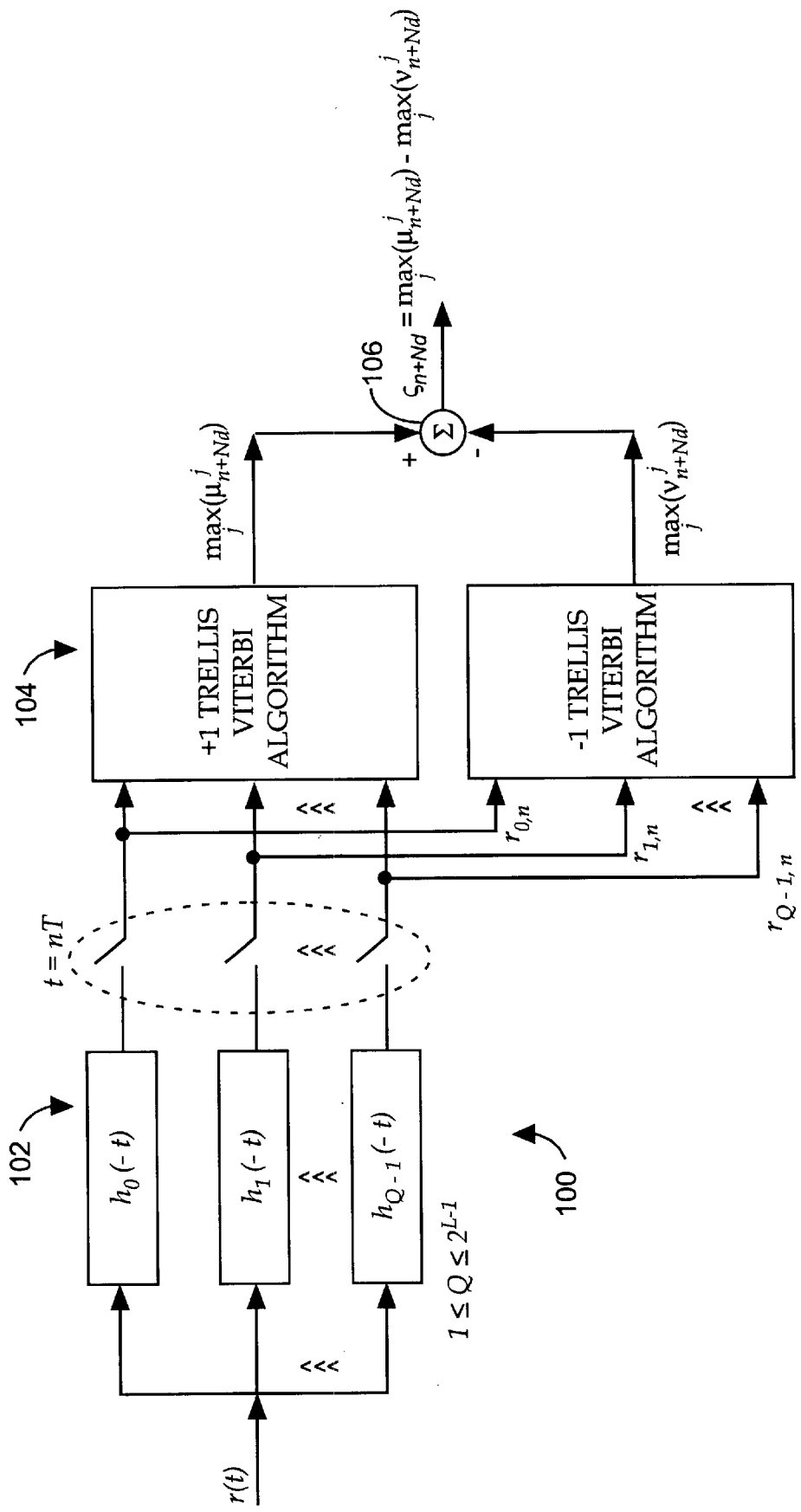
FIG. 1 is a diagram illustrating a soft output Viterbi demodulator according to an exemplary preferred embodiment of the present invention.

The following is a detailed description of the best presently known mode of carrying out the invention. This description is not to be taken in a limiting sense, but is made merely for the purpose of illustrating the general principles of the invention.

I. Theory and Operation of the SOVA Demodulator

Consider an equally probable binary sequence of N-bit length that is modulated into one of $2^N$ waveforms. Let s(t, $\underline{d}_j$) be the set of waveforms, $\underline{d}_j$ be the j-th data sequence, $0 \leq j < 2^N$, r(t) be the received signal through an additive white Gaussian noise channel with one-sided power spectral density $N_0$.

The optimum soft decision metric for the k-th bit of the N-bit sequence sent, defined as the natural logarithm of the ratio of likelihood of a +1 bit to that of a −1 bit conditioned on the observation r(t), can be expressed as $$\lambda_k = \log_e\left(\frac{Pr\{d_k = +1 \mid r(t), 0 \leq t \leq NT\}}{Pr\{d_k = -1 \mid r(t), 0 \leq t \leq NT\}}\right) \quad (1)$$

$$= \log_e\left(\frac{\sum_i \exp\left(\frac{2}{N_0}\int_0^{NT} r(t)s(t, \underline{d}_i, d_k = +1)dt\right)}{\sum_i \exp\left(\frac{2}{N_0}\int_0^{NT} r(t)s(t, \underline{d}_i, d_k = -1)dt\right)}\right)$$

where the expression s(t, $\underline{d}_i$, $d_k$=+1) signifies the corresponding waveform to an N-bit sequence for which the k-th bit is a +1 and likewise for s(t, $\underline{d}_i$, $d_k$=−1). T is the bit duration. See, Osborne, W. and Luntz, M., "Coherent and Noncoherent Detection of CPFSK", *IEEE Transactions on Communications*, VOL. 22, No. 8, August 1974, which is incorporated herein by reference. Unfortunately, the computational complexity of this optimum soft decision metric grows exponentially with sequence length and it is impractical to implement this optimum soft metric in a practical data communication system.

The method and processing system of the present invention employ the following approximation to the optimum soft decision metric:

$$\zeta_k = \frac{N_0}{2} \cdot \log_e\left(\frac{\max_i\left\{\exp\left(\frac{2}{N_0}\int_0^{NT} r(t)s(t, \underline{d}_i, d_k = +1)dt\right)\right\}}{\max_i\left\{\exp\left(\frac{2}{N_0}\int_0^{NT} r(t)s(t, \underline{d}_i, d_k = -1)dt\right)\right\}}\right) \quad (2)$$

$$= \frac{N_0}{2} \cdot \log_e\left(\frac{\exp\left(\frac{2}{N_0}\int_0^{NT} r(t)s(t, \underline{d}_{\hat{i}}, d_k = +1)dt\right)}{\exp\left(\frac{2}{N_0}\int_0^{NT} r(t)s(t, \underline{d}_{\hat{j}}, d_k = -1)dt\right)}\right)$$

$$= \int_0^{NT} r(t)s(t, \underline{d}_{\hat{i}}, d_k = +1)dt - \int_0^{NT} r(t)s(t, \underline{d}_{\hat{j}}, d_k = -1)dt$$

where $\hat{i}$ and $\hat{j}$ are the sequences that, over all possible length N sequences, maximize the correlations $$\int_0^{NT} r(t)s(t, \underline{d}_i, d_k = +1)dt$$

and $$\int_0^{NT} r(t)s(t, \underline{d}_i, d_k = -1)dt$$

respectively.

The above approximation to the computationally intractable optimum soft decision metric is based on the observation that a sum of many terms can be approximated by its dominant term with good accuracy when a dominant term exists in the sum and that, with increasing sequence length, such a dominant term is expected to prevail even with a moderate signal-to-noise ratio. The respective maximum correlations of the received signal among the set of all transmit signals for which the k-th bit is a +1 and a −1 are generated; knowledge of the channel noise level is not needed.

Referring to FIG. 1, a soft output Viterbi demodulator 100 according to an exemplary preferred embodiment of the present invention includes a bank of Laurent matched filters 102, branch metric computation blocks 104 and a differencer 106 configured as shown. FIGS. 2A–2B and 3A–3B, respectively, show the trellises for a 2- and 4-filter implementation of this SOVA demodulator. Extension to a larger filter set is also within the scope of the present invention.

Referring again to FIG. 1, the received complex signal enveloped in noise, denoted here also by r(t), is first filtered by the bank of Laurent matched filters 102, whose outputs are sampled at times t=nT, $1 \leq n \leq N$, to form an input sequence $\{r_n\}_{1 \leq n \leq N}$ where $r_n = (r_{0,n}, r_{1,n}, \ldots, r_{Q-1,n})$ and where $r_{q,n}$ is the complex output of the q-th Laurent filter. For additional description of Laurent matched filters, see Kaleh, G., "Simple Coherent Receivers for Partial Response Continuous Phase Modulation," *IEEE Journal on Selected Areas in Communications*, VOL.7, No. 9, December 1989, which is incorporated herein by reference. The number of filters required in the demodulator depends on the BT (bandwidth-time) product of the CPM phase shaping filter used in the modulator. For a BT product of ⅙ or larger, the difference in performance between a 2-filter implementation and a 4 or more filter implementation is insignificant. For a BT product smaller than ⅙, the improvement in performance using 4 or more filters could be substantial. Having generated the matched filter output sequence, it is then applied to a +1 trellis and a −1 trellis as shown in FIGS. 2A, 2B for a 2-filter demodulator and FIGS. 3A, 3B for a 4-filter demodulator.

The function of the +1 (−1) trellis is to seek, starting from time t=0 to time t=NT, the maximum among the correlations of the received signal with all possible transmit sequences whose k-th bit is a +1 (−1) using the Viterbi algorithm, as in equation (2). The processing of the +1 and −1 trellises are as follows: Initially the metrics of the trellis states, denoted by $x_j^i$, where i is the state index and j is the bit time index, are set to 0 and $N_d$ samples of the matched filter outputs $\{r_n\}_{1 \leq n \leq N_d}$ are processed by the Viterbi algorithm using the respective +1 and −1 trellis in accordance with the following branch metric computation, 2-filter:

$$\lambda(s_n, s_{n+1}) = \begin{cases} \text{Im}(r_{0,n})d_n - \text{Re}(r_{1,n})d_n d_{n-1} d_{n-2}; & n: \text{ even} \\ \text{Re}(r_{0,n})d_n - \text{Im}(r_{1,n})d_n d_{n-1} d_{n-2}; & n: \text{ odd} \end{cases} \quad (3a)$$

4-filter:

$$\lambda(s_n, s_{n+1}) = \begin{cases} \text{Im}(r_{0,n})d_n - \text{Re}(r_{1,n})d_n d_{n-1} d_{n-2} - \text{Im}(r_{2,n})d_n d_{n-2} d_{n-3} - \text{Re}(r_{3,n})d_n d_{n-1} d_{n-3}; & n: \text{ even} \\ \text{Re}(r_{0,n})d_n - \text{Im}(r_{1,n})d_n d_{n-1} d_{n-2} - \text{Re}(r_{2,n})d_n d_{n-2} d_{n-3} - \text{Im}(r_{3,n})d_n d_{n-1} d_{n-3}; & n: \text{ odd} \end{cases} \quad (3b)$$

After processing these Nd samples, the soft decision metric of the first bit is formed by differencing the maximum state metrics of the +1 and −1 trellises. Next, the initial state metrics of the +1 and −1 trellises are updated with the Viterbi algorithm and the filter output sample sequence $\{r_n\}_{2 \leq n \leq N_d+1}$ is processed by the Viterbi algorithm and the soft decision metric of the second bit is again formed by differencing the maximum state metrics of the +1 and −1 trellises. In general, then, the soft decision metric for the n-th bit is generated by first initializing the state metrics of both trellises with the prevailing maximum state metric, exercising the Viterbi algorithm over the trellises for the next $N_d$ filter output samples, and taking the difference of the maximum state metric of the +1 and −1 trellises, as illustrated in FIGS. 2A, 2B, 3A and 3B.

II. Application to a Convolutional Coded GMSK Signal with BT=⅙

Figure 4:
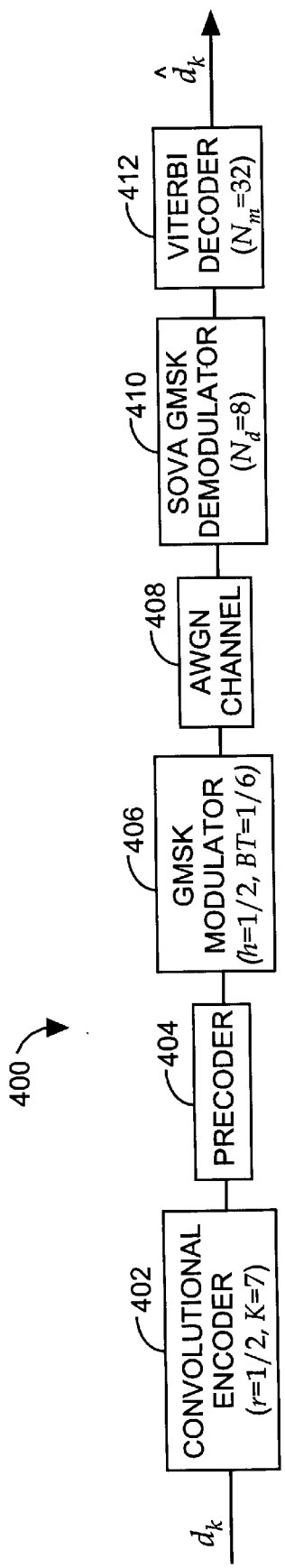
FIG. 4 is a functional block diagram illustrating a convolutional coded Gaussian Minimum Shift Keying (GMSK)

FIG. 4 shows a convolutional coded GMSK communication system 400 with a SOVA demodulator and soft-decision Viterbi decoder according to the present invention. The illustrated exemplary communications system 400 includes a convolutional encoder 402, precoder 404, GMSK modulator 406, Additive White Gaussian Noise (AWGN) channel 408, SOVA GMSK demodulator 410, and Viterbi decoder 412 configured as shown. The coded communication system 400 employs a rate ½ constraint length 7 convolutional code with pre-coded GMSK modulation for a BT=⅙. The code generators in octal representation are g1=133 and g2=171. The encoded GMSK signal is transmitted over the AWGN channel 408 and the received signal is demodulated with the 2-filter SOVA demodulator 410. Error correction decodings with the SOVA demodulator output (soft decision) and the sign of the output (hard decision) are performed using the Viterbi decoder 412 with a decoding path depth of 32 bits. The SOVA demodulator of the present invention is capable of providing both hard and soft bit decisions to an error correction code decoder.

Figure 5:
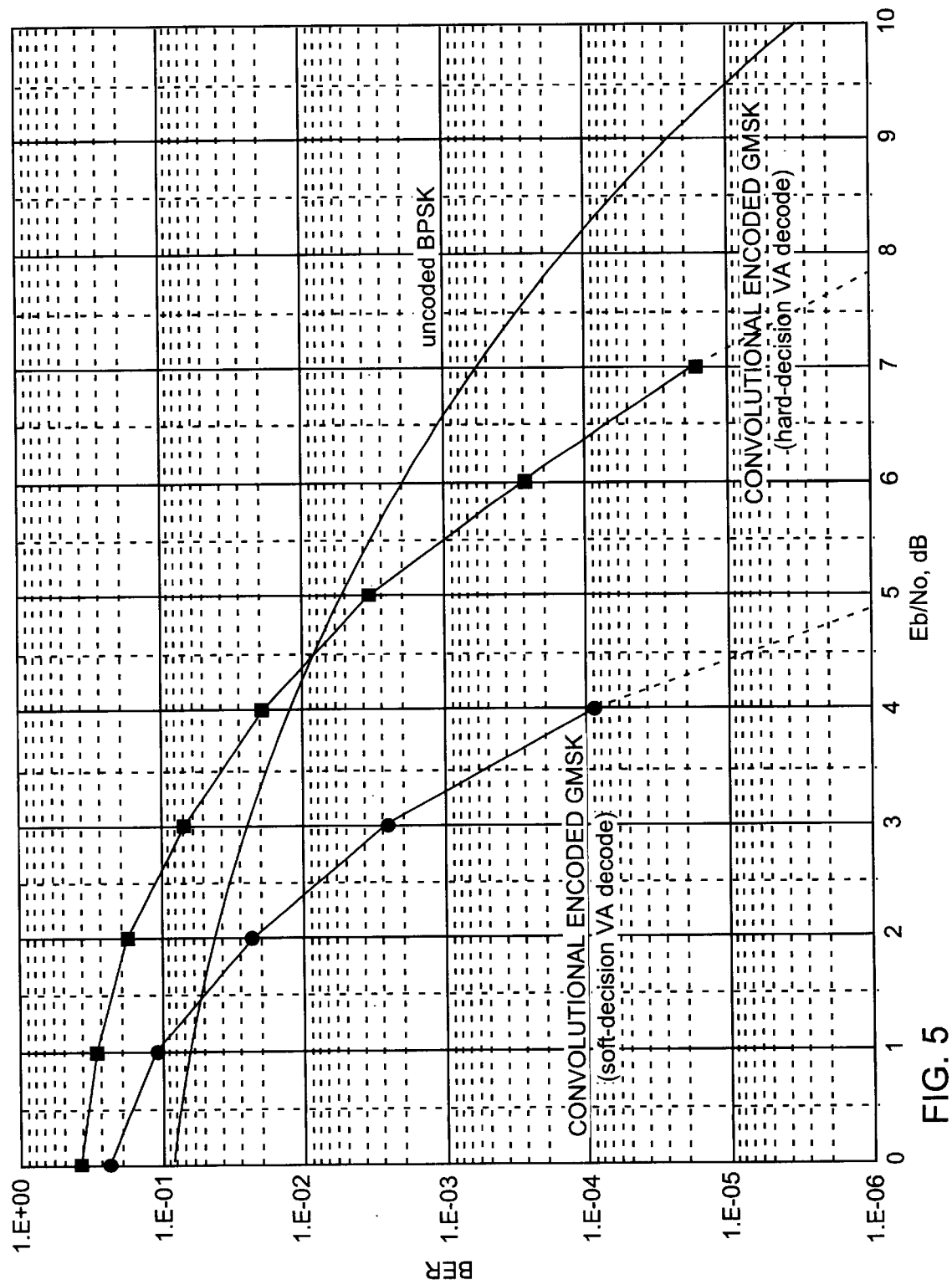
FIG. 5 is a plot illustrating simulated coded performance of the GMSK communication system with the SOVA demodulator of the present invention.

Referring to FIG. 5, the simulated coded performance of the system with the SOVA demodulator is illustrated. For a rate ½ constraint length 7 convolutional code decoded with the soft metric generated by the 2-filter SOVA, the observed result for an additive Gaussian noise channel shows that soft decoding performance according to the present invention is at least 2.4 dB superior to hard decision decoding for a pre-coded binary GMSK signal with a BT=⅙, at a decoded bit-error-rate (BER) of $10^{-4}$ or less.

Although the present invention has been described in terms of the preferred embodiment above, numerous modifications and/or additions to the above-described preferred embodiment would be readily apparent to one skilled in the art. It is intended that the scope of the present invention extends to all such modifications and/or additions.

We claim:

1. A method for approximating a posteriori probabilities of inputs to a finite state machine, comprising the steps of:
    exercising a Viterbi algorithm over M differently constrained trellises, one trellis for each of M possible input symbol values; and
    taking a difference of maximum state metrics of the differently constrained trellises to form likelihood ratios.

2. A method for determining a soft decision metric for each input symbol, comprising the steps of:
    computing trellis branch metrics based on a received sample sequence;
    updating initial state metrics from time (n−1) with a Viterbi algorithm (VA);
    constraining M trellises differently at time n such that only state transitions caused by an input value associated with a particular trellis are allowed;
    executing the VA on the M constrained trellises for a finite number ($N_d$) steps; and
    computing likelihood ratios by taking a difference of a maximum state metric at time (n+$N_d$) for each trellis with a maximum state metric of a reference trellis.

3. A method for estimating likelihood ratios of the input symbol values of an encoded sequence, comprising the steps of:
    providing an optimal decision metric for symbol-by-symbol detection;
    making relaxations or simplifications to the optimal decision metric to provide an approximation to the optimal decision metric; and
    processing a sample sequence employing a Viterbi algorithm (VA) and differently constrained trellises to implement the approximation to the optimal decision metric.

4. The method for estimating likelihood ratios of the input symbol values of an encoded sequence of claim 3, wherein the processing step comprises:
    exercising the VA over the differently constrained trellises for samples of the sample sequence; and
    taking a difference of maximum state metrics of the differently constrained trellises.

5. A processing system for estimating likelihood ratios for input symbol values, comprising:
    a processor configured to compute likelihood metrics on a symbol-by-symbol basis to determine an approximation to a maximum a posteriori estimate of a given symbol based on computing a maximum correlation of a received signal with all possible transmitted signals using a Viterbi algorithm over differently constrained trellisses.

6. The processing system for estimating likelihood ratios for input symbol values of claim 5, wherein the differently constrained trellises comprise M differently constrained trellises, where M is a number of possible input values.

7. The processing system for estimating likelihood ratios for input symbol values of claim 6, wherein the M differently constrained trellises comprise two differently constrained trellises.

8. The processing system for estimating likelihood ratios for input symbol values of claim 6, wherein the M differently constrained trellises comprise four differently constrained trellises.

9. The processing system for estimating likelihood ratios for input symbol values of claim 5, wherein the processor is configured to decode signals provided to the processor in accordance with a concatenated coding scheme.

10. The processing system for estimating likelihood ratios for input symbol values of claim 5, wherein the processor is configured to implement hard or soft demodulation of continuous phase modulation (CPM) signals.

11. The processing system for estimating likelihood ratios for input values of claim 10, wherein the CPM signals comprise uncoded CPM signals.

12. The processing system for estimating likelihood ratios for input values of claim 10, wherein the CPM signals comprise coded CPM signals.

13. The processing system for estimating likelihood ratios for input values of claim 10, wherein the CPM signals comprise binary CPM signals.

14. The processing system for estimating likelihood ratios for input values of claim 10, wherein the CPM signals comprise 4-ary CPM signals.

15. A processing system for estimating likelihood ratios for input symbol values, comprising:
    a decoder configured to implement a Viterbi algorithm (VA) on M differently constrained trellises for M values that an input to the decoder can take on at any given instant.

16. The processing system for estimating likelihood ratios for input symbol values of claim 15, wherein:
    the input comprises a binary input; and
    the M differently constrained trellises comprise two trellises.

* * * * *